(12) United States Patent  (10) Patent No.: US 9,151,814 B2
Albrecht et al.                (45) Date of Patent:     Oct. 6, 2015

(54) POWER ELECTRONICS ASSEMBLY FOR A MAGNETIC RESONANCE DEVICE (75) Inventors: Adam Albrecht, Nürnberg (DE); Horst Kröckel, Bamberg (DE)

(73) Assignee: Siemens Aktiengesellschaft, München (DE)

( * ) Notice: Subject to any disclaimer, the term of this patent is extended or adjusted under 35 U.S.C. 154(b) by 238 days.

(21) Appl. No.: 13/189,302

(22) Filed: Jul. 22, 2011

(65) Prior Publication Data
US 2012/0188717 A1  Jul. 26, 2012

(30) Foreign Application Priority Data

Jul. 23, 2010 (DE) .......................... 10 2010 032 078

(51) Int. Cl.
*H05K 7/20* (2006.01)
*G01R 33/36* (2006.01)
*G01R 33/34* (2006.01)

(52) U.S. Cl.
CPC ........ *G01R 33/3614* (2013.01); *H05K 7/20927* (2013.01); *G01R 33/3403* (2013.01)

(58) Field of Classification Search
CPC ........... H05K 7/20927; G01R 33/3403; G01R 33/3614
USPC .................... 361/702, 716–718, 721; 257/714
See application file for complete search history.

(56) References Cited

U.S. PATENT DOCUMENTS

| | | | | |
|---|---|---|---|---|
| 3,997,819 A * | 12/1976 | Eggert et al. | ................. | 361/704 |
| 5,285,347 A | 2/1994 | Fox et al. | | |
| 5,828,126 A * | 10/1998 | Thomas | ........................ | 257/695 |
| 5,937,937 A * | 8/1999 | Sehmbey et al. | ......... | 165/104.33 |
| 6,326,696 B1 * | 12/2001 | Horton et al. | .................. | 257/777 |
| 6,687,126 B2 * | 2/2004 | Patel et al. | ..................... | 361/702 |
| 7,149,087 B2 * | 12/2006 | Wilson et al. | ................. | 361/699 |
| 7,869,714 B2 * | 1/2011 | Patel et al. | ..................... | 398/118 |
| 8,081,463 B2 * | 12/2011 | Chiu-Mao et al. | ............ | 361/702 |
| 2003/0067750 A1 * | 4/2003 | Garcia | .......................... | 361/702 |
| 2009/0041466 A1 * | 2/2009 | Patel et al. | ..................... | 398/130 |
| 2010/0195285 A1 * | 8/2010 | Noshadi et al. | ............... | 361/702 |
| 2011/0013359 A1 * | 1/2011 | Goldrian et al. | ......... | 361/679.54 |
| 2011/0232864 A1 * | 9/2011 | Zaffetti | ........................ | 165/80.4 |

FOREIGN PATENT DOCUMENTS

DE   10 2007 061 596 A1   7/2009
WO   WO 2010/076682 A1   7/2010

OTHER PUBLICATIONS

German Office Action dated Jun. 27, 2011 for corresponding German Patent Application No. DE 10 2010 032 078.1 with English translation.

* cited by examiner

*Primary Examiner* — Anatoly Vortman
*Assistant Examiner* — Jacob Crum
(74) *Attorney, Agent, or Firm* — Lempia Summerfield Katz LLC (57) ABSTRACT

A power electronics assembly for a magnetic resonance device includes a housing and at least one printed circuit board (PCB) arranged in the housing with at least one power electronics component to be cooled. The PCB has an at least one millimeter thick backside layer that may be made of copper. The power electronics assembly also includes a stabilizing cooling plate configured as part of the housing and/or the housing includes at least one coolant channel open on at least one side, so that the PCB mounted on the cooling plate comes into direct contact with coolant guided in the coolant channel in an area of the power electronics components with the backside layer.

16 Claims, 6 Drawing Sheets

POWER ELECTRONICS ASSEMBLY FOR A MAGNETIC RESONANCE DEVICE

This application claims the benefit of DE 10 2010 032 078.1, filed on Jul. 23, 2010.

BACKGROUND

The present embodiments relate to a power electronics assembly for a magnetic resonance device.

Magnetic resonance devices according to the prior art have become widely known. In these magnetic resonance devices, a transmitting antenna (e.g., a transmit antenna) that excites spins of an object to be examined that is oriented in a main magnetic field is provided. High frequency, high power pulses are applied to the transmitting antenna. The high power pulses are made available by a transmitting unit (e.g., a transmit unit) to a magnetic resonance device, which includes a power amplifier unit.

The transmit units or power amplifier units of the magnetic resonance device are examples of power electronics assemblies in a magnetic resonance device. Power electronics components, in which a high level of dissipation is to be achieved in a minimal volume, are involved. Effective cooling is to be provided. The requirements are increased if the power electronics units are to be realized to be as structurally compact as possible. A cooling solution should also be immune to the leakage fields of the main magnet of the gradient system and the high frequency transmit antennae. No high frequency fields may be emitted, in order to not negatively influence the magnetic resonance receive signal originating from the object. The cooling system is to work as noiselessly as possible and demonstrate a high level of robustness against coolant pressure fluctuations and different coolant mixtures. If the unit is realized as part of the screened housing, the cooling system should also enable high frequency shield attenuation and voltage protection against the cooling water as well as having a high level of mechanical robustness.

It is known for high frequency-power assemblies (e.g., the high power components) to be cooled with air. This demands large heat sinks or a powerful stream of cooling air from a powerful fan. Liquid cooling systems are also known. In a liquid cooling system, a tubular cooler or a micro channel cooler is arranged in the housing. The tubular cooler or the micro channel is connected to the heat-generating components via a heat dissipation mechanism. Both of the solutions described here pose large space requirements, as, for example, the air-cooled solution calls for the configuration of most of the power components in a utility room; the necessary cooling performance thus cannot be achieved at the magnet. The described water cooling also takes up such a large volume that the water cooling cannot be realized at the magnetic resonance magnet.

SUMMARY AND DESCRIPTION

The present embodiments may obviate one or more of the drawbacks or limitations in the related art. For example, an improved cooling system for a power electronics assembly for a magnetic resonance device may be specified.

To achieve this object, a power electronics assembly for a magnetic resonance device (e.g., a power amplifier unit) includes a housing and at least one printed circuit board (PCB) with at least one power electronics component to be cooled arranged in the housing. The at least one PCB has a backside layer at least one millimeter in thickness (e.g., made of copper) and a stabilizing cooling plate embodied as part of the housing, and/or the housing has at least one coolant channel open at least on one side, such that the PCB mounted on the cooling plate comes into direct contact with coolant guided in the coolant channel in an area of the power electronics component with the backside layer.

The present embodiments propose an architecture of the assembly that combines electronic, mechanical and cooling qualities particularly advantageously. At least one cooling plate with at least one coolant channel may be built into the housing (e.g., in the center). The cooling plate may be constructed in planar form and carries one or a plurality of directly cooled electronic PCBs with a robust backside layer. The cooling plate with the at least one coolant channel conveys coolant (e.g., water with special additives) precisely to points of the PCB where cooling of the individual electronic high power components is required. The cooling plate forms a stiffening support for the housing, and boosts mechanical stability.

The performance of the cooling is thus initially significantly improved. The coolant may be routed precisely to the places (e.g., under high pressure) where the coolant is required for cooling purposes. A part of the PCB directly contacts the backside layer, so that a direct cooling is realized. The backside layer, which may, for example, include copper, is embodied to be particularly thick (e.g., more than one millimeter thick, four millimeters thick) in order to be able to withstand the coolant pressure. The cooling plate may, for example, be five to seven millimeters thick (e.g., six millimeters thick). The thickness of the backside layer is determined by the requirements. How much power per time unit in terms of dissipation arises may be determined. Requirements in terms of the flow speed of the coolant in the coolant channel may be derived from the determined power per time unit. If, for example, a coolant flow speed of the coolant of two meters per second applies, an inlet pressure of 3 to 3.5 bar may be used. Thus, a thickness of the backside layer of four millimeters may be used (generally, such backside layers, which also serve as shielding and as ground, are up to around 100 μm in thickness). The backside layer fulfills the mechanical and electric function at the same time, because alongside the usual backside layer function of a PCB, the cooling medium may flow at high flow speed at points where high cooling performance is required, in order to achieve optimum heat transfer. Thus, for example, temperatures of less than 1 K/W may be achieved, even for small transistor chips.

A second group of advantages of the present embodiments arise in the area of construction. Coolant hoses or coolant pipes between the individual components may no longer be used in the housing. The cooling plate fulfills a dual function: the cooling plate serves simultaneously as a carrier for the electronic PCB modules and as stiffening for the housing. The cooling plate and the thick backside layer may be used at the same time as a screening surface for EMC requirements. Where the cooling plate is used, the coolant network may be planned with a high degree of flexibility, where the structure of the coolant channels is related to the circuitry structure on the PCBs, corresponding, for example, to the electrical wiring systems on the PCB.

The electronic PCB modules created by the PCBs may be mounted and demounted in any sequence. A further advantage lies in the fact that the coolant may be drained from the cooling plate and PCB configuration without any assisting devices, with the aid of the siphoning effect. The cooling plate, which may also be designated as a coolant guidance plate, and the thick backside layer may advantageously be manufactured in a milling procedure or an injection molding procedure if the cooling plate is realized in plastic.

A very compact configuration of the assembly is consequently achieved at minimal cost. The cooling system operates almost noiselessly, for example, relative to the size and the cooling performance. This is, for example, enabled by the direct cooling. The backside layer forms a boundary of the coolant channel in the assembled state.

The configuration described here is also reliable. If, for example, copper is selected as the material for the backside layer and for the cooling plate, and if an appropriate sealing element made of rubber (will be examined in greater detail below), the coolant may come into contact with two materials. Thus, a lastingly high resistance may be achieved even against aggressive coolant and pressure fluctuations of the coolant. Coolants with special magnetic resonance (MR) properties (e.g., shifted echo times) may be used without problems.

In one embodiment, a single coolant channel routed through the cooling plate may be provided such that the backside layer is in contact with the coolant at the location of all power electronic components to be cooled. A single coolant channel may be used, so that a single inlet and a single outlet are used as connections. The coolant channel of the cooling plate may be continuously set into the cooling plate. Structures of any desired complexity may be used, as long as the coolant may be transported at sufficiently high speed through the single coolant channel, and sufficient heat dissipation capacity is achieved.

In one embodiment, at least one PCB may be arranged on each planar side of the cooling plate, where, for example, the coolant channel is open at least in part on both sides. In the case of a cooling plate advantageously arranged centrally in the housing, both sides of the cooling plate may be used for population with PCBs. With one single cooling plate, two complete PCBs or two PCB architectures that are also arranged in a space-saving manner may be cooled. At least one PCB may be provided on just one side of the cooling plate.

It is advantageous if the cooling plate is arranged as supporting stiffening of the housing, essentially centrally in the housing. For example, the cooling plate may be fixed on two or on four side walls of the housing (e.g., using a screw fixing or the like). Alternatively, the cooling plate may form a part of the housing (e.g., a side wall of the housing).

The PCB may be populated or provided on the side facing away from the cooling plate directly with surface-mountable components or structures. In one embodiment, at least one power electronics component may be mounted in a recess of the PCB directly on the backside layer, for example, in order to achieve better cooling access. The PCB may be cut out for the mounting of surface-mountable power electronics components, so that the surface-mountable power electronics components may be directly mounted on the backside layer. The components are thus arranged closer to the coolant.

The robust backside layer may be connected to the PCB using an electrically conductive adhesive and/or by screw fixing and/or riveting, or may be soldered to the PCB. Different connections that ensure that an electrical contact may be created with structures of the PCB at prespecified positions may be used.

In one embodiment, the backside layer projects beyond the PCB in at least one area. The robust backside layer may not be covered with the PCB or a plurality of PCBs at all points, but may also project beyond the PCB. This is expedient if the backside layer is to serve as a screening element that also covers the area not occupied by a PCB. In one embodiment, the backside layer may serve in the projecting area as a carrier for coolant connections to the coolant channels of the cooling plate.

The PCB, at least in part, is at a distance from the backside layer (e.g., to accommodate a component to be mounted on the backside layer). The PCB may be offset relative to the robust backside layer if taller components (e.g., components that are accommodated in a Miniblock housing) are to be mounted in between. Conventional components may also be used if a local spacing between the PCB and the backside layer is taken into consideration. Conventional components are frequently cheaper, so use of conventional components may be desirable.

In one advantageous embodiment, at least one PCB may project over the cooling plate in at least one area. Advantageously, the projecting area of the PCB may be populated with less power-intensive components (e.g., on both sides of the projecting area). The projecting area, which is not restricted on both sides by the cooling plate, is thus suited to accommodate non cooling-intensive parts of the circuitry provided on the PCB. Conventional components (e.g., components in Miniblock housings) may advantageously be employed in the projecting area.

In one embodiment, the backside layer, at contact points to the coolant channel, has, at least in part (e.g., completely), a structuring designed to increase the area of contact with the coolant (e.g., a rib structure). The robust backside layer may thus be provided in part or wholly with a structuring (e.g., a rib structure) on a side facing towards the coolant channel in order to enlarge the surface coming into contact with the coolant and thus to provide an improved heat dissipation. Other types of structuring such as, for example, known from other cooling concepts may be used.

In one embodiment, the backside layer has at least one cavity formed towards the PCB for field guidance. The fact that a thick backside layer is present may, in addition, advantageously be used for the purposes of field formation/field guidance, which are of specific importance in magnetic resonance devices. Hollows (e.g., cavities) that serve to guide high frequency magnetic flow and/or electric fields may be provided. For example, in the case of a four millimeter thick backside layer, the cavities may have a depth of three millimeters. The backside layer thus not only provides mechanical stability and direct contact with the coolant, but the backside layer is also used for integration of structures designed to guide electric and magnetic fields. In one embodiment, a resonance structure is provided within the cavity (e.g., arranged on a PCB).

In one embodiment, a sealing element (e.g., a packing cord) running, for example, adjacent to the coolant channel to seal off the cooling plate against the backside layer is provided. The sealing element may, for example, be made of rubber. A sealing profile for sealing off the backside layer against the cooling plate may also be provided.

At a transition between two PCBs attached to the same side of the cooling plate, the coolant may be routed via the side of the cooling plate facing away from the PCBs. Thus, if, for example, there is a contour line between two PCBs, the coolant is guided via the other side of the cooling plate, so that escape of coolant is prevented. A special cover plate may also be used (e.g., instead of or in addition to the PCBs) to cover the open coolant channels. If no PCB is arranged on the opposite side of the cooling plate, a cover plate that prevents the escape of coolant is provided.

At least one flow-influencing and/or cooling plate stiffening element (e.g., at least a stud) may be provided in the coolant channel. As well as the stiffening effect of such elements (e.g., studs), eddies may be generated in the coolant using the at least one flow-influencing and/or cooling plate stiffening element. Studs that may have a form suitable for the generation of eddies are suitable.

In one embodiment of the assembly, the cooling plate and/or the PCB may have at least one through-opening for cables and/or a secondary coolant (e.g., air) outside, for example, the areas around the coolant channel sealed with the sealing element. The cooling plate and the PCB may be provided with structures and drilled holes outside the sealed areas in order to route cables and/or a secondary cooling medium (e.g., air). The cooling plate serves simultaneously as a heat-exchanger in order to cool the secondary cooling medium. If continuous through-openings through the cooling plate and the one or a plurality of PCBs are provided, the continuous through-openings may be aligned with each other. Areas of the cooling plate not populated with coolant channels for other purposes may be used by the through-openings.

The cooling plate may include copper or a plastic (e.g., an epoxy or a glass fiber plastic). Where a plastic is used, the plastic of the cooling plate may be metalized on the surface. In this way, an electrical contact to the backside layer is created. Protection against osmosis is also provided. Even in the case of high pressure, particles of the coolant may penetrate the plastic. The metallization of the surfaces may, for example, be realized using a coating method.

In addition to the assembly, a magnetic resonance device with one embodiment of an assembly may be provided. In a magnetic resonance device of this kind, to which the features otherwise described in relation to the assembly may be transferred, power electronics assemblies (e.g., a power amplifier unit) may be arranged directly on the magnet (e.g., the main magnet unit), as the power electronics assemblies may be realized in a space-saving and robust way.

DETAILED DESCRIPTION OF THE DRAWINGS

Figure 1:
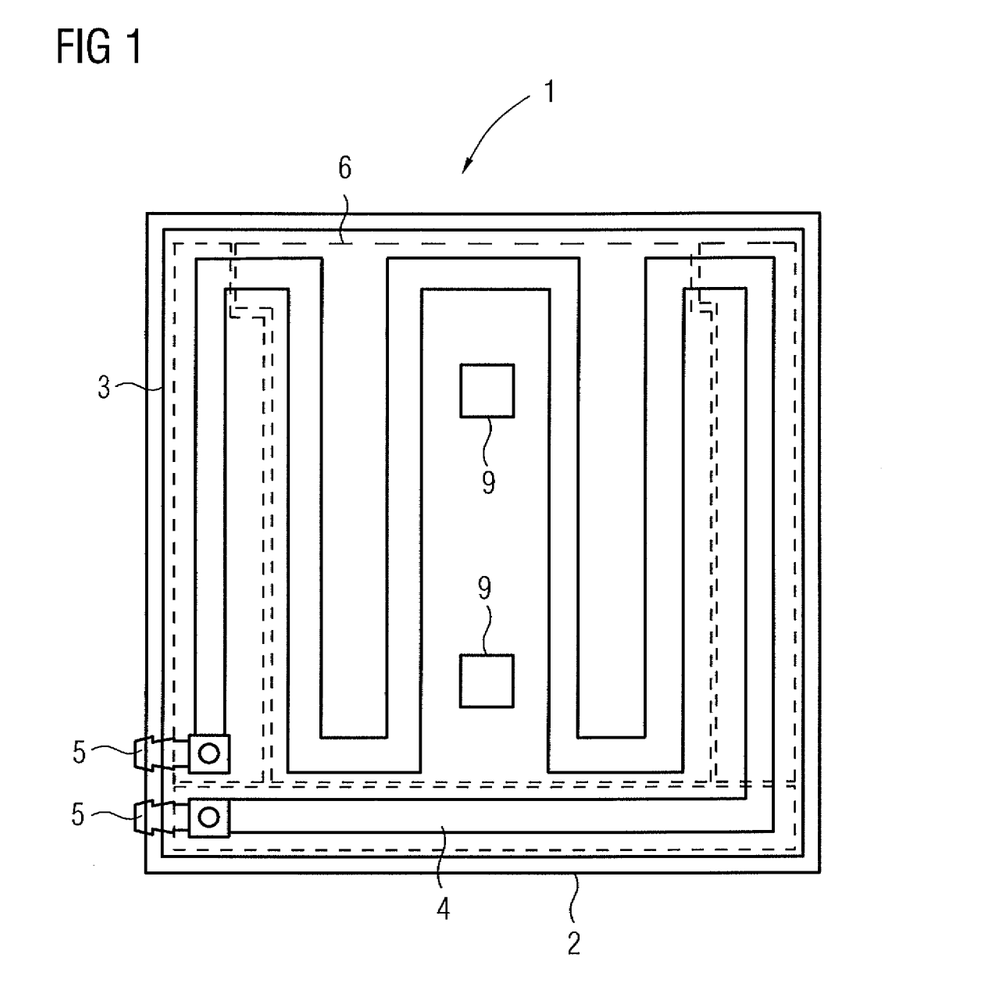
FIG. 1 shows a cross section through one embodiment of an assembly in a first plane.

FIG. 1 shows a cross section through one embodiment of a power electronics assembly 1 (e.g., a power amplifier unit). The power electronics assembly 1 includes a housing 2, in which a cooling plate 3 is centrally mounted, stiffening the housing 2. The cooling plate 3, which includes copper, for example, but may also be made of plastic, contains an individual, continuous coolant channel 4, through which, using two connections 5, a coolant may be routed under high pressure. In the embodiment shown in FIG. 1, the coolant channel 4 is at least in part embodied to be open on both sides, so that the coolant flowing in the coolant channel 4 may directly contact the backside layer of a printed circuit board (PCB) 6, which is shown in FIG. 1 as a dashed line. In the embodiment shown in FIG. 1, a plurality of PCBs 6 are shown arranged on one side of the cooling plate 3.

Figure 2:
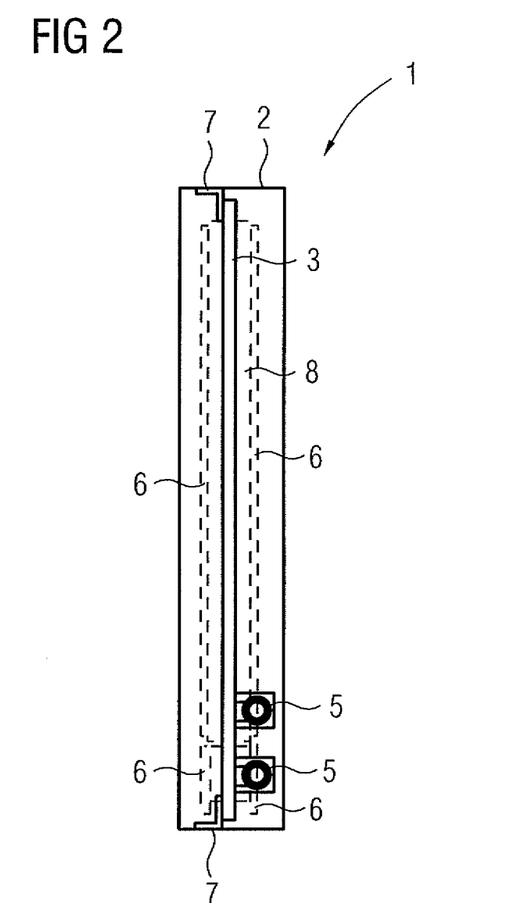
FIG. 2 shows a cross section through one embodiment of an assembly in a second plane, the second plane being perpendicular to the first plane.

In the cross section shown in FIG. 2, which is perpendicular to the cross section shown in FIG. 1, the cooling plate 3 is arranged in the center of the housing 2 on brackets 7, stiffening the housing 2. The PCBs 6 are attached onto both sides of the cooling plate 3. In one embodiment, the cooling plate 3 has a thickness of six millimeters. The PCBs 6 have a thick and robust backside layer 8 that, for example, includes copper and is four millimeters thick.

In another embodiment, a plurality of cooling plates 3 may be arranged in one housing 2.

The course of the coolant channel 4 may be set such that as soon as the PCBs 6 with the backside layer 8 are attached to the cooling plate 3, the coolant channel is diverted underneath all the power electronics components to be cooled. Both the cooling plate 3 and the backside layer 8 may each serve a number of purposes. Besides the cooling of power electronics components on the PCBs 6, the cooling plate 3 also provides stiffening/stabilization of the housing 2, in the center of which the cooling plate 3 is arranged. The backside layer 8 is thicker and thus more robustly embodied than conventional backside layers of PCBs 8, so that the backside layer 8, which in the assembled state forms a boundary of the coolant channel, withstands the pressure of the coolant and serves as part of the PCB 6 as a heat transfer medium from the power electronics component to the coolant.

The course of the coolant channels 4 is arranged such that the course guides coolant precisely to parts of the PCB 6 where the coolant is used to cool the individual electronic components. The cooling plate 3 carries the electronic PCB modules, stiffens the housing 2 and guides the coolant.

In one embodiment, both the cooling plate 3 and the backside layer 8 include copper. The cooling plate 3 and the backside layer 8 may thus also be used as a screening surface for EMC requirements.

As shown in FIG. 1, the cooling plate 3 and the PCBs 6 have aligned through-openings 9 that may serve as cable ducting or as a through-opening for a secondary cooling medium (e.g., air). An air-cooling device with a ventilator of the same kind may also be arranged in the housing 2, but is not represented in greater detail here.

Figure 3:
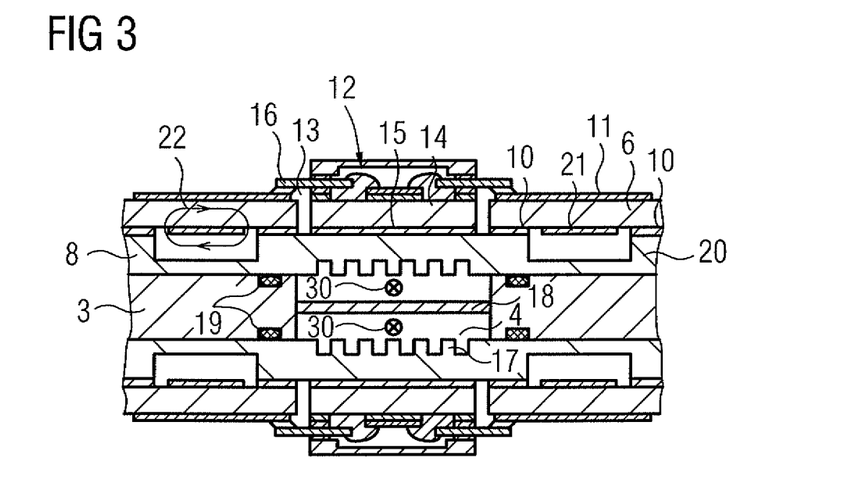
FIG. 3 shows a sectional view through one embodiment of a cooling plate with oppositely arranged printed circuit boards (PCBs)

FIG. 3 shows, in a further sectional view, a detail of the cooling plate 3 with PCBs 6 with backside layers 8 attached to the cooling plate on opposite sides. As shown in the embodiment of FIG. 3, the backside layer 8 is fixed to the PCB 6 using an electrically conductive adhesive 10. Other types of fixing may be used.

Circuit board conductors 11 are provided on the PCB 6. While power electronics components 12 may also be mounted on the PCB 6, FIG. 3 shows a slightly modified case. As shown in FIG. 3, a recess 13 is provided in the PCB 6, so that the power electronics component 12 having a substrate 14 may be directly attached to the backside layer 8 using a layer of solder, for example. The power electronics component 12 (e.g., a transistor) is connected to the circuit board conductors 11 via feeds 16.

Using the coolant channels 4 running on the opposite side of the backside layer 8, an efficient cooling may be effected via the backside layer 8. The backside layer 8 may directly contact the coolant. In order to increase the contact area, the side of the backside layer 8 facing away from the PCB 6 is provided with a rib structure 17.

FIG. 3 further shows a stud 18 running through the coolant channels 4. The stud 18 serves a dual purpose. The stud 18 stabilizes the cooling plate 3 overall, and the stud 18 generates eddies in the coolants flowing at high speed through the coolant channels in the direction of the arrow 30, which further improve the cooling effect.

In one embodiment, a sealing element 19 (e.g., a packing cord) running adjacent to the coolant channels 4 for sealing-off between the backside layer 8 and the cooling plate 3 is provided.

FIG. 3 also shows another advantageous usage of the robust, thick backside layer 8. Cavities 20 (e.g., hollows) are provided at the side of each of the power electronics components 12. The cavities 20 serve field guidance purposes. A resonator structure 21 may also be provided in the hollows 20. A magnetic flow 22 or an electrical field, for example, may thus be guided.

Figure 4:
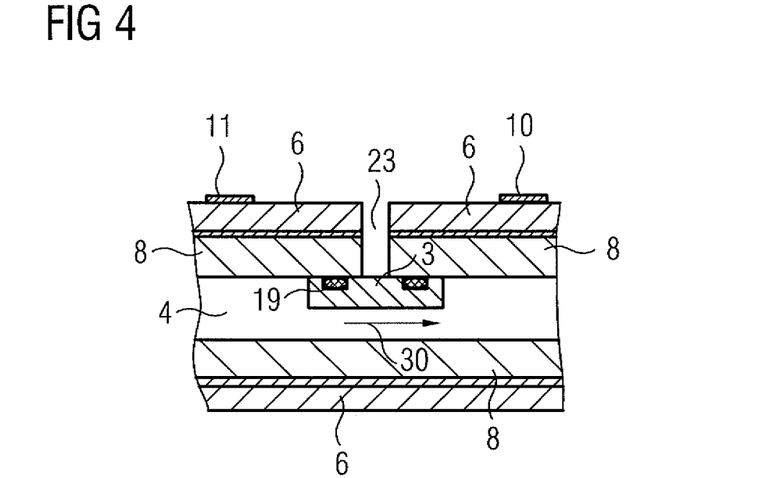
FIG. 4 shows a further cross section at a joint of two PCBs.

FIG. 4 shows a sectional view close to a contour line 23 of two adjacent PCBs 6. In order to avoid coolant emerging from the coolant channel 4 at this point, the coolant channel 4 is at this point embodied closed on one side and sealed accordingly using sealing elements 19.

Figure 5:
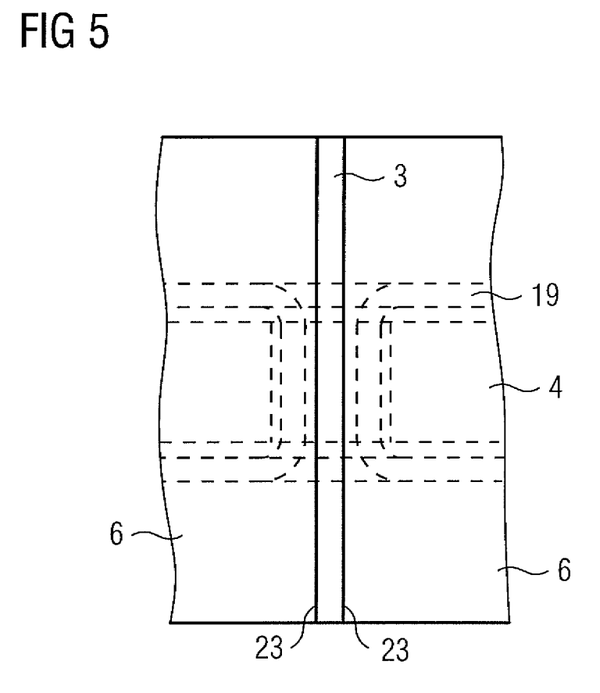
FIG. 5 shows a top view of the joint shown in FIG. 4.

FIG. 5 shows a top view of a joint with the contour line 23. Represented in the form of dotted lines are the coolant channel 4 and the course of the sealing elements 19, including the sealing elements 19 provided on the underside.

Figure 6:
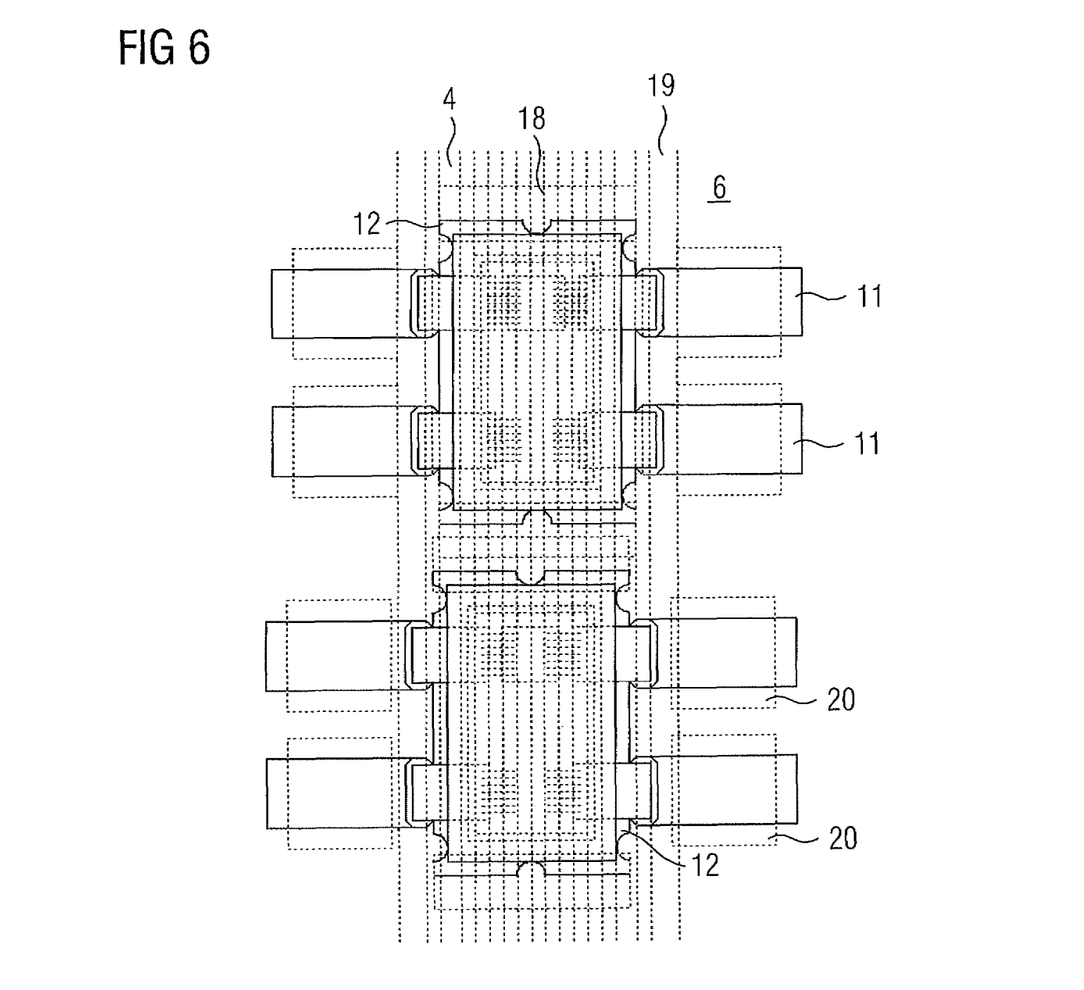
FIG. 6 shows a top view of part of a PCB with the underlying structure.

FIG. 6 is a top view of a PCB 6 in an area of two power electronics components 12, where structures of the cooling plate 3 and the backside layer 8 are represented by dashed lines. The studs 18, which serve to provide stabilization and to generate eddies, are thus shown within the coolant channels 4. The sealing elements 19 are routed along the coolant channels 4. Also indicated are the hollows 20 in the backside layer 8.

In one embodiment, the backside layer 8 may, in part, project beyond the PCB 6. The backside layer projection may, for example, be used as a carrier for the two connections 5. In another embodiment, the PCB 6 is, in part, at a distance from the backside layer 8, so that, for example, a component may be arranged there in a Minibox housing.

Figure 7:
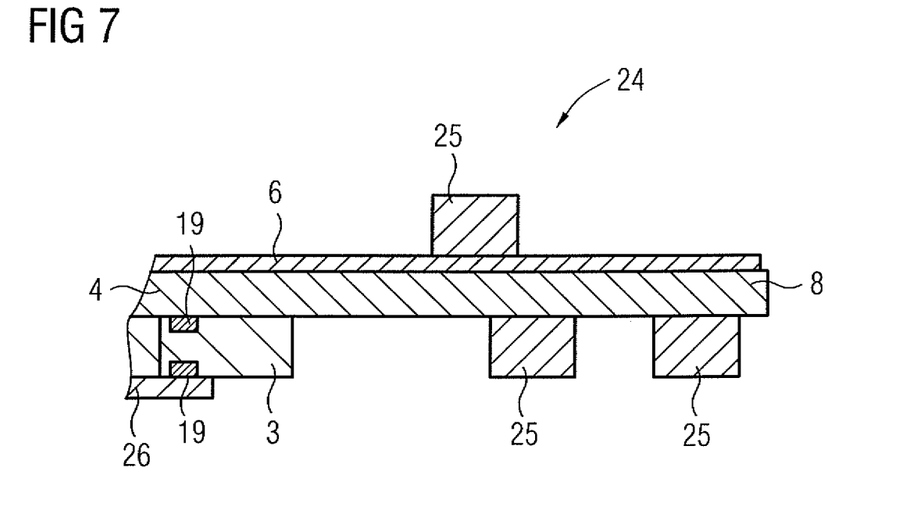
FIG. 7 shows another embodiment of an assembly.

As illustrated with the modified exemplary embodiment shown in FIG. 7, the PCB 6 may project laterally beyond the cooling plate 3. Less cooling-intensive components 25 are arranged in a projecting area 24. The less cooling-intensive components 25 may be arranged in part on the top side and in part on the backside of the PCB 6. Conventional components (e.g., components in Minibox-housings) that require little cooling may be employed in the projecting areas 24 without problems.

FIG. 7 also illustrates the use of a cover plate 26 on a coolant channel 4 if no PCB 6 is provided at one point on an open coolant channel 4. Sealing elements 19 may also be employed at the one point.

Figure 8:
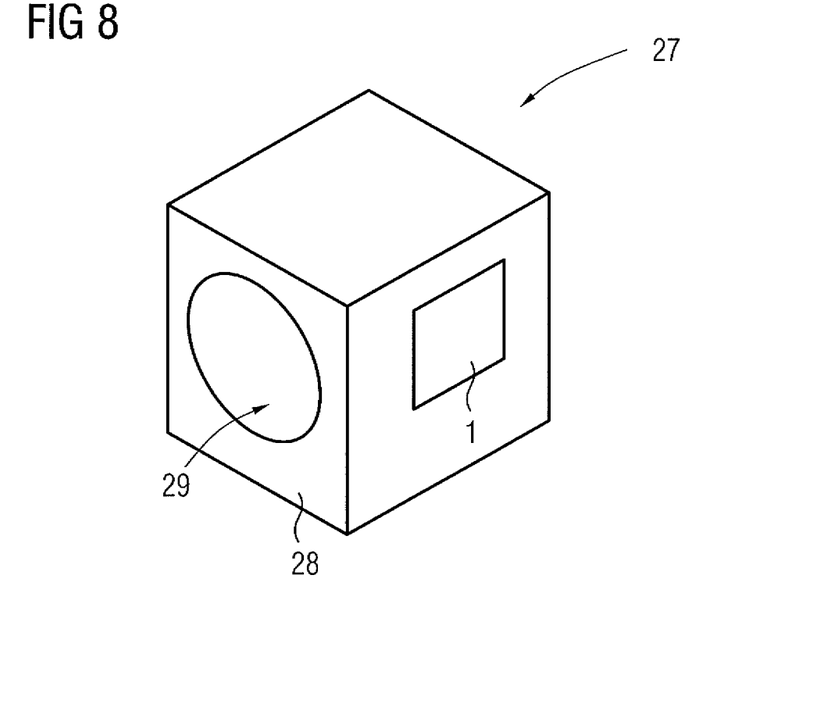
FIG. 8 shows one embodiment of a magnetic resonance device.

FIG. 8 illustrates the principle of a magnetic resonance device 27 of the present embodiments. The magnetic resonance device 27 includes a main magnet unit 28, in which superconductive coils, for example, are arranged for generation of a main magnetic field. The main magnet unit 28 surrounds a patient aperture 29. The power electronics assembly 1 (e.g., the power amplifier unit) of one embodiment is arranged on the main magnet unit 28. This is possible because of the compact, robust, stable and compactly dimensioned structure of the power electronics assembly 1.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A power electronics assembly for a magnetic resonance device, the power electronics assembly comprising:
   a housing;
   a first printed circuit board (PCB) arranged in the housing with a power electronics component to be cooled, the PCB having an at least one millimeter-thick backside layer;
   a second PCB arranged in the housing;
   a stabilizing cooling plate that is attached to an internal surface of the housing, the first PCB being mountable on a first side of the stabilizing cooling plate in an area of the power electronics component with the backside layer, and the second PCB being mountable on a second side of the stabilizing cooling plate; and
   a sealing element that seals off the stabilizing cooling plate against the backside layer,
   wherein the first PCB and the second PCB are attached to the internal surface of the housing only via the stabilizing cooling plate, and
   wherein the power electronics component is mounted in a recess of the first PCB directly on the backside layer.

2. The assembly as claimed in claim 1, wherein the first PCB is arranged in the housing with a plurality of power electronic components to be cooled, the plurality of power electronics components comprising the power electronics component.

3. The assembly as claimed in claim 1, wherein the stabilizing cooling plate is arranged as a supporting stiffening of the housing essentially centrally in the housing.

4. The assembly as claimed in claim 1, wherein the backside layer projects beyond the first PCB in at least one area.

5. The assembly as claimed in claim 1, wherein the backside layer has at least one cavity facing the first PCB, the at least one cavity being sized for field guidance.

6. The assembly as claimed in claim 1, wherein the stabilizing cooling plate, the first PCB, or the stabilizing cooling plate and the first PCB have at least one through-opening for cables, a secondary coolant, or the cables and the secondary coolant.

7. The assembly as claimed in claim 1, wherein the stabilizing cooling plate comprises copper or a plastic.

8. The assembly as claimed in claim 7, wherein the stabilizing cooling plate comprises the plastic, and
   wherein the plastic is metalized on a surface.

9. The assembly as claimed in claim 1, wherein the first PCB projects beyond the stabilizing cooling plate in at least one area, and
   wherein the at least one projecting area on both sides of the first PCB is populated with less power-intensive components.

10. The assembly as claimed in claim 1, wherein the at least one millimeter-thick backside layer is made of copper.

11. The assembly as claimed in claim 1, wherein the sealing element comprises a packing cord.

12. The assembly as claimed in claim 6,
   wherein the at least one through-opening is located outside a sealed area around the coolant channel sealed with the sealing element.

13. The assembly as claimed in claim 7, wherein the stabilizing cooling plate comprises an epoxy or glass fiber plastic.

14. A magnetic resonance device comprising:
   a power electronics assembly comprising:
      a housing;

a first printed circuit board (PCB) arranged in the housing with a power electronics component to be cooled, the PCB having an at least one millimeter-thick backside layer; and a second PCB arranged in the housing;

a stabilizing cooling plate that is attached to an internal surface of the housing, the first PCB being mountable on a first side of the stabilizing cooling plate in an area of the power electronics component with the backside layer, and the second PCB being mountable on a second side of the stabilizing cooling plate; and a sealing element that seals off the stabilizing cooling plate against the backside layer, wherein the first PCB and the second PCB are attached to the internal surface of the housing only via the stabilizing cooling plate.

15. A power electronics assembly for a magnetic resonance device, the power electronics assembly comprising:

a housing;

a first printed circuit board (PCB) arranged in the housing with a power electronics component to be cooled, the PCB having an at least one millimeter-thick backside layer;

a second PCB arranged in the housing;

a stabilizing cooling plate that is attached to an internal surface of the housing, the first PCB being mountable on a first side of the stabilizing cooling plate in an area of the power electronics component with the backside layer, and the second PCB being mountable on a second side of the stabilizing cooling plate; and a sealing element that seals off the stabilizing cooling plate against the backside layer, wherein the first PCB and the second PCB are attached to the internal surface of the housing only via the stabilizing cooling plate, and wherein the backside layer has at least one cavity facing the PCB, the at least one cavity being sized for field guidance.

16. The power electronics assembly as claimed in claim 1, wherein the housing comprises a plurality of sides defining a cavity of the housing, and wherein the stabilizing cooling plate is connected to two sides of the plurality of sides defining the cavity of the housing.

* * * * *